(12) United States Patent
Chen (10) Patent No.: US 12,119,430 B2
(45) Date of Patent: Oct. 15, 2024

(54) COLOR FILM SUBSTRATE, METHOD FOR PREPARING COLOR FILM SUBSTRATE, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Lixuan Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/607,332

(22) PCT Filed: Sep. 15, 2021

(86) PCT No.: PCT/CN2021/118543
§ 371 (c)(1),
(2) Date: Oct. 28, 2021

(87) PCT Pub. No.: WO2023/035297
PCT Pub. Date: Mar. 16, 2023

(65) Prior Publication Data
US 2024/0047626 A1 Feb. 8, 2024

(30) Foreign Application Priority Data
Sep. 9, 2021 (CN) .......................... 202111054417.2

(51) Int. Cl.
*H01L 33/50* (2010.01)
*H01L 21/02* (2006.01)
*H01L 27/15* (2006.01)

(52) U.S. Cl.
CPC ...... *H01L 33/502* (2013.01); *H01L 21/02288* (2013.01); *H01L 27/156* (2013.01)

(58) Field of Classification Search
CPC ............. H01L 33/502; H01L 21/02288; H01L 27/156; H01L 33/505; H01L 33/60;
(Continued)

(56) References Cited

U.S. PATENT DOCUMENTS 7,489,375 B2 * 2/2009 Lee .................... G02F 1/133512
349/108
2018/0284534 A1 * 10/2018 Song ................. G02F 1/133512
(Continued)

FOREIGN PATENT DOCUMENTS

CN 106707610 A 5/2017
CN 108919560 A 11/2018
(Continued)

OTHER PUBLICATIONS

Chinese Office Action issued in corresponding Chinese Patent Application No. 202111054417.2 dated Apr. 8, 2022, pp. 1-8.
(Continued)

*Primary Examiner* — Jonathan Han
(74) *Attorney, Agent, or Firm* — PV IP PC; Wei Te Chung (57) ABSTRACT

The present application provides a color film substrate, a method for preparing the color film substrate, and a display panel; wherein the color film substrate comprises a substrate, a light shielding layer and a plurality of pixel units arranged on the substrate, a plurality of openings are formed on the light shielding layer, and a condensing component is arranged at bottoms of parts of the openings, wherein the condensing component is used for converging emitted light of the first color sub-pixel unit and the second color sub-pixel unit, so as to change an emission angle of the emitted
(Continued)

light to alleviate a problem of a poor light extraction efficiency of existing QDCF structures under a front viewing angle.

20 Claims, 3 Drawing Sheets

(58) Field of Classification Search
CPC ... H01L 25/0753; H01L 33/58; H10K 59/122; H10K 71/135; H10K 50/858; H10K 71/00; H10K 59/879; H10K 59/8792; H10K 59/38
See application file for complete search history.

(56) References Cited

U.S. PATENT DOCUMENTS

| | | | |
|---|---|---|---|
| 2020/0075879 A1* | 3/2020 | Luo | H10K 77/111 |
| 2020/0321400 A1* | 10/2020 | Park | H10K 59/12 |

FOREIGN PATENT DOCUMENTS

| | | |
|---|---|---|
| CN | 109148727 A | 1/2019 |
| CN | 110045539 A | 7/2019 |
| CN | 111261662 A | 6/2020 |
| CN | 111261663 A | 6/2020 |
| CN | 111505866 A | 8/2020 |

OTHER PUBLICATIONS

International Search Report in International application No. PCT/CN2021/118543, mailed on May 25, 2022.
Written Opinion of the International Searching Authority in International application No. PCT/CN2021/118543, mailed on May 25, 2022.

* cited by examiner

COLOR FILM SUBSTRATE, METHOD FOR PREPARING COLOR FILM SUBSTRATE, AND DISPLAY PANEL

RELATED APPLICATIONS

This application is a Notional Phase of PCT Patent Application No. PCT/CN2021/118543 having international filing date Sep. 15, 2021, which claims the benefit of priority of Chinese Patent Application No. 202111054417.2 filed on Sep. 9, 2021. The contents of the above applications are all incorporated by reference as if fully set forth herein in their entirety.

BACKGROUND OF INVENTION

Field of Invention

The present application relates to a field of display, and particularly to a color film substrate, a method for preparing a color film substrate, and a display panel.

Description of Prior Art

Quantum dot light-emitting diode (QD LED) displays are composed of quantum dot color filters (QDCF) and blue organic light-emitting diodes (OLED) or blue micro light-emitting diodes (LED) or blue mini LEDs, which excite quantum dots through blue self-luminous light sources to realize characteristics of wide viewing angles, a high color gamut, a thinness, and flexibility. The QD LED display uses a photoluminescence characteristic of quantum dots (QDs) in QDCF to convert blue light into red light and green light, so as to achieve a purpose of a full-color display. In conventional QDCF structures, a quantum dot film is arranged on a substrate and separated by light absorbing materials such as black matrix (BM). However, in the above QDCF structures, light emitted from the quantum dots will be totally reflected when passing through the substrate and emitting from the substrate to air, and a black matrix structure between quantum dot films will also absorb and affect the light emitted from the quantum dot films, thus affecting a light extraction efficiency of the quantum dot films, and resulting in a poor light extraction efficiency of the QDCF display under a front viewing angle.

SUMMARY OF INVENTION

The present application provides a color film substrate, a method for preparing a color film substrate, and a display panel to alleviate a technical problem of a poor light extraction efficiency of existing QDCF structures under a front viewing angle.

In order to solve the above problem, technical solutions provided in the present application are as follows:

Firstly, the present application provides a color film substrate, wherein the color film substrate comprises:
 a substrate;
 a light shielding layer, wherein the light shielding layer is arranged on one side of the substrate, and a plurality of openings are formed on the light shielding layer, and each opening exposes a part of the substrate; and
 a plurality of pixel units, wherein each of the pixel unit comprises a first color sub-pixel unit, a second color sub-pixel unit and a third color sub-pixel unit respectively located in different openings;
 wherein, in the corresponding opening, a condensing component is arranged between the first color sub-pixel unit and the second color sub-pixel unit and the substrate, and the condensing component is used for converging emitted light of the first color sub-pixel unit and the second color sub-pixel unit.

In the color film substrate provided by the embodiment of the present application, wherein a cross section of a contact surface between the condensing component and the corresponding pixel unit is an arc, and a center of the arc is located on one side of the corresponding pixel unit.

In the color film substrate provided by the embodiment of the present application, wherein a refractive index of the condensing component is less than a refractive index of the corresponding pixel unit.

In the color film substrate provided by the embodiment of the present application, wherein a thickness H1 of an edge area of the condensing component and a thickness H2 of a middle area of the condensing component satisfy a relationship: $H1/H2 > 1.5$.

In the color film substrate provided by the embodiment of the present application, wherein the thickness H1 of the edge area of the condensing component and a length L1 of a bottom surface of the condensing component satisfy a relationship: $H1/L1 > 5\%$.

In the color film substrate provided by the embodiment of the present application, wherein a hydrophilic film layer is provided on a surface of the light shielding layer corresponding to the condensing component.

In the color film substrate provided by the embodiment of the present application, wherein the first color sub-pixel unit comprises a red quantum dot film, the second color sub-pixel unit comprises a green quantum dot film, and the third color sub-pixel unit directly transmits blue light.

Secondly, the present application provides a display panel, which comprises the color film substrate in any one of the above embodiments and a light-emitting unit, and the light-emitting unit is located on one side of the pixel unit away from the substrate.

Thirdly, the present application also provides a method for preparing a color film substrate, which comprises:
 providing a substrate;
 preparing a light shielding layer on the substrate, patterning the light shielding layer to form a plurality of openings, and each three openings correspond to a pixel unit;
 printing a first ink in two of the three openings corresponding to the pixel unit using an ink jet printing process to form a condensing component; and
 preparing a first color sub-pixel unit and a second color sub-pixel unit of the pixel unit on the condensing component.

In the method for preparing a color film substrate provided by the embodiment of the present application, wherein the step of printing the first ink in two of the three openings corresponding to the pixel unit using the ink jet printing process to form the condensing component further comprises:
 coating a hydrophilic film layer on partial inner walls of the two openings corresponding to the pixel unit; and
 printing the first ink in the opening coated with the hydrophilic film layer and drying to form a film to form the concave condensing component with a thick edge area and a thin middle area.

In the method for preparing a color film substrate provided by the embodiment of the present application, wherein a thickness H1 of the edge area of the condensing component and a thickness H2 of the middle area of the condensing component satisfy a relationship: H1/H2>1.5.

In the method for preparing a color film substrate provided by the embodiment of the present application, wherein the thickness H1 of the edge area of the condensing component and a length L1 of a bottom surface of the condensing component satisfy a relationship: H1/L1>5%.

In the method for preparing a color film substrate provided by the embodiment of the present application, wherein the step of preparing the first color sub-pixel unit and the second color sub-pixel unit of the pixel unit on the condensing component further comprises:

printing a second ink on the condensing component using the ink jet printing process to form a red quantum dot film as the first color sub-pixel unit of the pixel unit, and a refractive index of the first color sub-pixel unit is greater than that of the condensing component; and printing a third ink on the condensing component using the ink jet printing process to form a green quantum dot film as the second color sub-pixel unit of the pixel unit, and a refractive index of the second color sub-pixel unit is greater than that of the condensing component.

The present application provides the color film substrate, the method for preparing the color film substrate and the display panel. In the method for preparing the color film substrate, by using the ink jet printing process to prepare micro lens as the condensing component, emitted light of the red quantum dot film and the green quantum dot film in the pixel unit will converge after passing through the condensing component, so as to change an emission angle of the emitted light, reduce a probability of total reflection of the emitted light at an interface of the substrate, and improve the light extraction efficiency of the emitted light. Thus, a brightness under the front viewing angle is increased, and the problem of the poor light extraction efficiency of the existing QDCF structures under the front viewing angle is solved.

BRIEF DESCRIPTION OF DRAWINGS

In order to explain embodiments or technical solutions in prior arts clearly, the following will briefly introduce drawings needed to be used in description of the embodiments or the prior arts. It is obvious that the drawings in the following description are only some embodiments of the invention. For those skilled in the art, other drawings can also be obtained from these drawings without paying creative labor.

DETAILED DESCRIPTION OF EMBODIMENTS

The following description of embodiments is made with reference to additional illustrations to illustrate specific embodiments that can be implemented in the present application. Directional terms mentioned in the present application, such as [up], [down], [front], [back], [left], [right], [inside], [outside], [side], etc., are only directions of reference to additional schemas. Therefore, the directional terms used are intended to explain and understand the present application, not to limit the present application. In the drawings, units with similar structures are represented by same label. thicknesses of some layers and areas are exaggerated for clear understanding and easy description in the following drawings.

Figure 1:
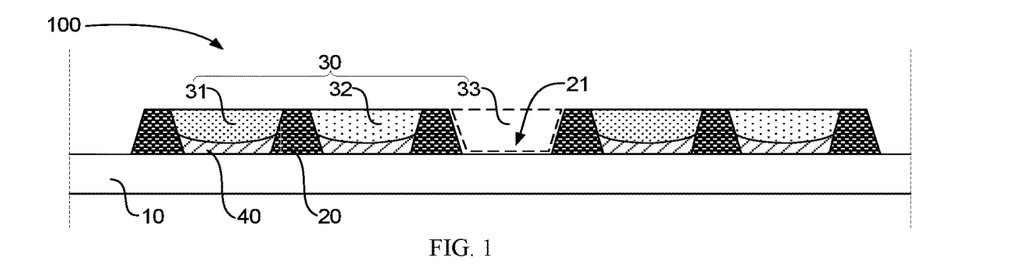
FIG. 1 is one sectional schematic diagram of a color film substrate provided by an embodiment of the present application.
Figure 2:
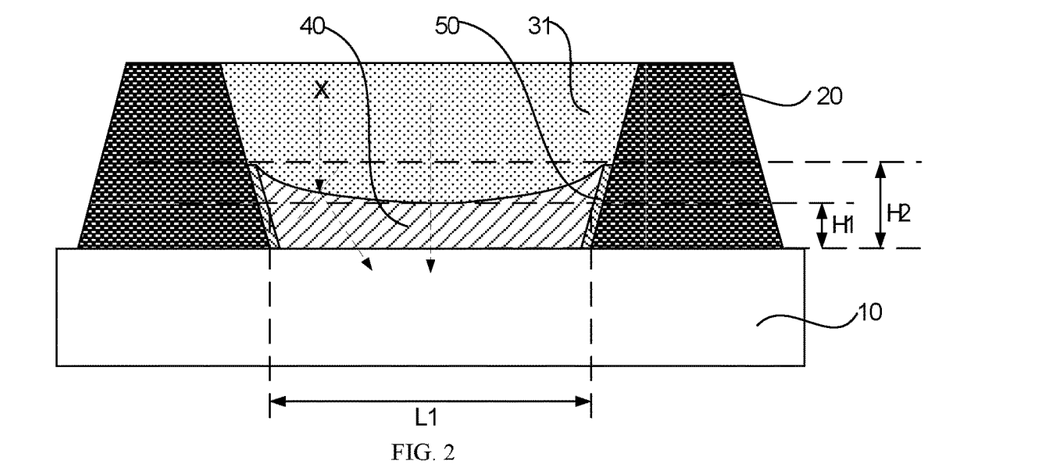
FIG. 2 is a detailed schematic diagram of the color film substrate provided by the embodiment of the present application.

Please refer to FIG. 1 and FIG. 2. FIG. 1 is one sectional schematic diagram of a color film substrate provided by an embodiment of the present application, and FIG. 2 is a detailed schematic diagram of the color film substrate provided by the embodiment of the present application. The color film substrate 100 comprises a substrate 10, a light shielding layer 20 and a plurality of pixel units 30 arranged on one side of the substrate 10. The substrate 10 comprises a substrate with a high transmittance such as a glass substrate to improve a light extraction efficiency of the color film substrate 100. The light shielding layer 20 is arranged on one side of the substrate 10. A plurality of openings 21 are formed on the light shielding layer 20, and each opening 21 exposes a part of the substrate 10. Each pixel unit 30 comprises a first color sub-pixel unit 31, a second color sub-pixel unit 32, and a third color sub-pixel unit 33 located in different openings 21, respectively. In the corresponding opening 21, a condensing component 40 is arranged between the first color sub-pixel unit 31 and the second color sub-pixel unit 32 and the substrate 10, wherein the condensing component 40 is used for converging emitted light of the first color sub-pixel unit 31 and the second color sub-pixel unit 32.

Specifically, among the plurality of openings 21 of the light shielding layer 20, each three openings 21 corresponds to a pixel unit 30. Each pixel unit 30 comprises a first color sub-pixel unit 31, a second color sub-pixel unit 32 and a third color sub-pixel unit 33 located in different openings 21, respectively. Wherein, the pixel unit 30 is used to present various colors to achieve a color display. An area of a top of each opening 21 is larger than an area of a bottom of each opening 21, so that a cross-sectional shape of the opening 21 is an inverted trapezoid, so as to avoid an undercutting phenomenon at the bottom of the opening 21, which is not conducive to preparations of other devices. Wherein, the bottom of the opening 21 refers to one side of the opening 21 close to the substrate 10, and the top of the opening 21 refers to one side of the opening 21 away from the substrate 10. Alternatively, materials of the light shielding layer 20 comprise light absorbing materials such as black matrix (BM) to avoid a crosstalk between sub-pixel units 30 of different colors.

The first color sub-pixel unit 31 comprises a red quantum dot film, the second color sub-pixel unit 32 comprises a green quantum dot film, and the third color sub-pixel unit 33 directly transmits blue light. Since the third color sub-pixel unit 33 can directly transmit the blue light, a quantum dot film and the condensing component 40 do not need to be set in the opening 21 corresponding to the third color sub-pixel unit 33, thus, a region of the third color sub-pixel unit 33 is illustrated in a dotted box in FIG. 1.

The red quantum dot film is formed by doping red quantum dots into a polymer solution and then curing the polymer solution, and the green quantum dot film is formed by doping green quantum dots into a polymer solution and then curing the polymer solution. Quantum dots are core-shell structures composed of semiconductor materials, and each quantum dot comprises quantum dot central core and outer shell. For example, the central core can be a core made of CdSe and the outer shell can be a shell made of ZnS. The quantum dots can convert absorbed short wavelength light into longer wavelength light, and wavelengths of emitted light of the quantum dots vary with different particle sizes and compositions. For example, the red quantum dots will emit red light if excited by light, and the green quantum dots will emit green light if excited by light, wherein, particle sizes of the green quantum dots are small, and particle sizes of the red quantum dots are large.

Alternatively, the red quantum dot film and the green quantum dot film can also be doped with scattering particles, wherein materials of the scattering particles comprise inorganic semiconductor materials with high refractive index such as titanium dioxide and zirconia. A scattering intensity of light is different for the materials with different refractive index, the greater the refractive index, the greater the scattering intensity. When excitation light irradiates the scattering particles with the high refractive index, the excitation light will be scattered by the scattering particles, and scattered light can excite the quantum dots again, so as to increase optical paths of the excitation light in the quantum dot film, and improve a utilization of blue light, thus to improve a light efficiency of the quantum dots, reduce an amount of the quantum dots and reduce a cost. Moreover, selecting the scattering particles with appropriate particle sizes can also expand mutual distances between the quantum dots, so as to reduce a self-absorption phenomenon between the quantum dots and improve a light extraction rate. For example, a range of the particle sizes of the scattering particles can be set to 200 nm to 1 micron.

When the color film substrate 100 is irradiated by a blue light source, the red quantum dot film can emit red light because it is provided with the red quantum dots, so that the first color sub-pixel unit 31 can emit red light. Similarly, the green quantum dot film can emit green light because it is provided with the green quantum dots, so that the second color sub-pixel unit 32 can emit green light. While the third color sub-pixel unit 33 can directly transmit blue light because it is not provided with the quantum dots, so that each pixel unit 30 comprises three basic color lights of red, green and blue to present different colors.

In each pixel unit 30, the condensing component 40 is arranged between the first color sub-pixel unit 31 and the second color sub-pixel unit 32 and the substrate 10, and the condensing component 40 can converge the emitted light of the first color sub-pixel unit 31 and the second color sub-pixel unit 32. A cross section of a contact surface between the condensing component 40 and the corresponding pixel unit 30 is an arc, and a center of the arc is located on one side of the corresponding pixel unit 30. That is, the condensing component 40 is arranged at the bottom of the opening 21 and covers the substrate 10 exposed by the opening 21. A surface of the condensing component 40 away from the substrate 10 is a concave surface, a cross-section shape of the concave surface is an arc, and the corresponding pixel unit 30 is located in the opening 21 and fills the concave surface of the condensing component 40, so as to make a shape of the cross section of the contact surface between the condensing component 40 and the corresponding pixel unit 30 is the arc, and the center of the arc is located on one side of the corresponding pixel unit 30. In this way, the condensing component 40 has a function of micro lens.

Alternatively, the condensing component 40 can be formed by printing a first ink with a certain refractive index in the corresponding opening 21 using an ink jet print (IJP) process. In order to form the concave surface on the surface of the condensing component 40, a hydrophilic film layer 50 is provided on the surface of the light shielding layer 20 corresponding to the condensing component 40 to make the printed first ink accumulate in an area close to the light shielding layer 20, so that an amount of ink in a middle area will be less than an amount of ink close to the light shielding layer 20, then the first ink will form the expected concave surface after curing into a film. Of course, the embodiment of the present application is not limited to setting the hydrophilic film layer 50 on the surface of the light shielding layer 20, for example, a hydrophobic film layer can also be set on the surface of the substrate 10 exposed by the opening 21, which can also achieve a purpose of forming the concave surface on the surface of the condensing component 40.

Moreover, a refractive index of the condensing component 40 is less than a refractive index of the corresponding pixel unit 30, wherein a range of the refractive index of the pixel unit 30 is 1.8 to 2.1, and a range of the refractive index of the condensing component 40 is 1.4 to 1.65. For example, the refractive index of the pixel unit 30 is 1.9, and the refractive index of the condensing component 40 is 1.5. Taking the first color sub-pixel unit 31 as an example, the refractive index of the condensing component 40 is less than a refractive index of the first color sub-pixel unit 31, which can make emitted light of the first color sub-pixel unit 31 converge. As shown schematically in FIG. 2, emitted light X of the first color sub-pixel unit 31 is refracted when passing through an interface between the first color sub-pixel unit 31 and the condensing component 40, then refracted light will converge. Specifically, when light enters the first color sub-pixel unit 31, it is converted into red light by the first color sub-pixel unit 31 and then the red light will emit. When the red light emitted by the first color sub-pixel unit 31 pass through the interface between the first color sub-pixel unit 31 and the condensing component 40, since the interface between the first color sub-pixel unit 31 and the condensing component 40 is the arc and the refractive index of the first color sub-pixel unit 31 is greater than the refractive index of the condensing component 40, an emission angle of the emitted light of the first color sub-pixel unit 31 will change and close to a middle in a converging state. In this way, which can reduce a probability of total reflection of the emitted light of the first color sub-pixel unit 31 when entering the substrate 10. At the same time, an absorption of the emitted light of the first color sub-pixel unit 31 by the light shielding layer 20 can be reduced, and a light extraction efficiency of the first color sub-pixel unit 31 can be greatly improved to increase a brightness of the first color sub-pixel unit 31 at a front viewing angle.

Accordingly, due to an existence of the condensing component 40 corresponding to the second color sub-pixel unit 32, an emission angle of the emitted light of the second color sub-pixel unit 32 will also change and close to a middle in a converging state, which can reduce a probability of total reflection of the emitted light of the second color sub-pixel unit 32 when entering the substrate 10. At the same time, an absorption of the emitted light of the second color sub-pixel unit 32 by the light shielding layer 20 can be reduced, and a light extraction efficiency of the second color sub-pixel unit 32 can be greatly improved to increase a brightness of the second color sub-pixel unit 32 at a front viewing angle, which solve a problem of a poor light extraction efficiency of existing QDCF structures at a front viewing angle.

Further, a thickness H1 of an edge area of the condensing component 40 and a thickness H2 of a middle area of the condensing component 40 satisfy a relationship: H1/H2>1.5, and the thickness H1 of the edge area of the condensing component 40 and a length L1 of a bottom surface of the condensing component satisfy a relationship: H1/L1>5%, so as to form the condensing component 40 with a high curvature and improve the light extraction efficiency. Wherein the thickness H1 of the edge area of the condensing component 40 is less than or equal to 10 microns, the thickness H2 of the middle area of the condensing component 40 is less than 6.6 microns, and the length L1 of the bottom surface of the condensing component 40 ranges from 15 microns to 100 microns. For example, the thickness H1 of the edge area of the condensing component 40 is 9.9 microns, the thickness H2 of the middle area of the condensing component 40 is 6.1 microns, and the length L1 of the bottom surface of the condensing component 40 is 99 microns, then H1/H2=1.6, and H1/L1=10%.

In addition, the surface of the condensing component 40 away from the substrate 10 is the concave, the edge area of the condensing component 40 refers to an area with a highest height of the condensing component 40 relative to the substrate 10, and the middle area of the condensing component 40 refers to an area with a lowest height of the condensing component 40 relative to the substrate 10. A thickness difference between the thickness H1 of the edge area of the condensing component 40 and the thickness H2 of the middle area of the condensing component 40 can be controlled by controlling an affinity between the light shielding layer 20 and the substrate 10 relative to the first ink forming the condensing component 40. The light shielding layer 20 with a hydrophilic surface will cause a strong climbing phenomenon of the first ink, and then control a strength of a "coffee ring effect" of the first ink to control the thickness difference between the edge area and the middle area of the condensing member 40.

Figure 3:
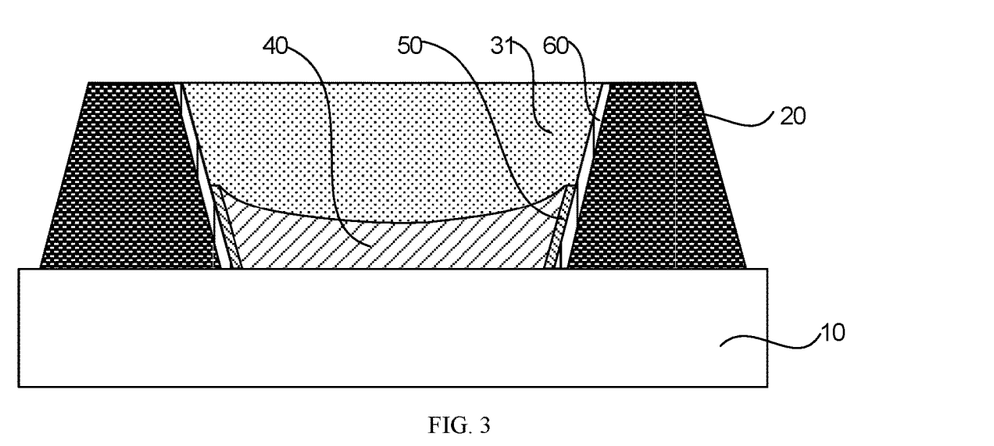
FIG. 3 is another sectional schematic diagram of the color film substrate provided by the embodiment of the present application.

In one embodiment, please refer to FIG. 3, which is another sectional schematic diagram of the color film substrate provided by the embodiment of the present application. Different from the above embodiment, the surface of the light shielding layer 20 is provided with a reflection layer 60 in the opening 21 corresponding to the first color sub-pixel unit 31 and the second color sub-pixel unit 32. After light in the first color sub-pixel unit 31 and the second color sub-pixel unit 32 strike the reflection layer 60, it will be reflected back into the first color sub-pixel unit 31 and the second color sub-pixel unit 32 so that the light will not enter the light shielding layer 20, which improves a utilization of the light and further improves a light extraction efficiency of the pixel unit 30. For other descriptions, please refer to the above embodiment and will not be repeated here.

Figure 4:
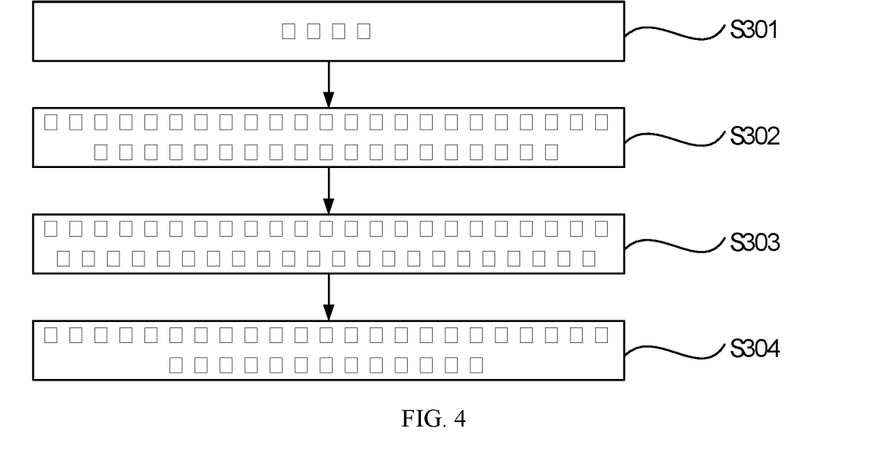
FIG. 4 is a flow schematic diagram of a method for preparing the color film substrate provided by the embodiment of the present application.
Figure 5:
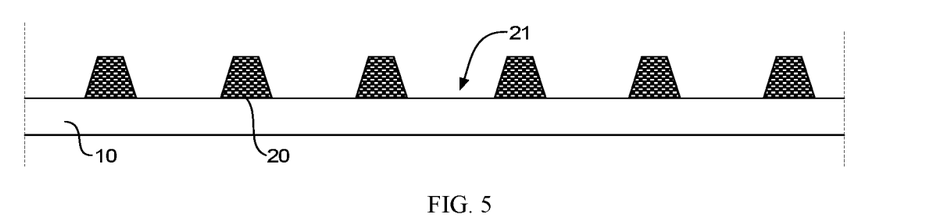
FIG. 5 and FIG. 6 are sectional schematic diagrams of the color film substrate prepared in each step of the method for preparing the color film substrate provided by the embodiment of the present application.
Figure 6:
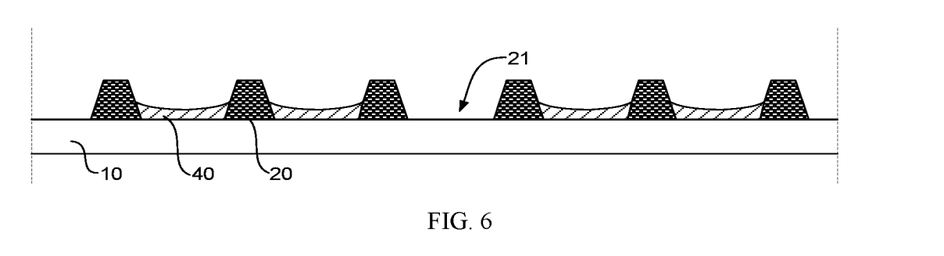

In one embodiment, a method for preparing the color film substrate is provided. Please refer to FIG. 1 to FIG. 6, FIG. 4 is a flow schematic diagram of the method for preparing the color film substrate provided by the embodiment of the present application, FIG. 5 and FIG. 6 are sectional schematic diagrams of the color film substrate prepared in each step of the method for preparing the color film substrate provided by the embodiment of the present application. The method for preparing the color film substrate comprises following steps:

S301: provide the substrate 10;

Specifically, the substrate 10 comprises the substrate with the high transmittance such as the glass substrate to improve the light extraction efficiency of the color film substrate 100. Taking the glass substrate as an example, a step of providing the substrate 10 also comprises steps of cleaning and drying the glass substrate.

S302: preparing the light shielding layer 20 on the substrate 10, patterning the light shielding layer 20 to form the plurality of openings 21, and each three openings 21 correspond to the pixel unit 30;

Specifically, preparing the light shielding layer 20 on the substrate 10 using the light absorbing materials such as the black matrix by a coating or lithography process, then patterning the light shielding layer 20 to form the plurality of openings 21, and each three openings 21 correspond to the pixel unit 30. The area of the top of each opening 21 is larger than the area of the bottom of each opening 21, so that the cross-sectional shape of the opening 21 is the inverted trapezoid, so as to avoid an undercutting phenomenon at the bottom of the opening 21, which is not conducive to the preparations of other devices.

S303: printing the first ink in two of the three openings 21 corresponding to the pixel unit 30 using the ink jet printing processes to form the condensing component 40;

Specifically, coating the hydrophilic film layer 50 is in two of the three openings 21 corresponding to the pixel unit 30, and the hydrophilic film layer 50 is only coated on part of an inner wall of the two openings 21 corresponding to the pixel unit 30, that is, on the surface of the light shielding layer 20 close to the substrate 10 in the opening 21.

Printing the first ink in the opening 21 coated with the hydrophilic film layer 50 and drying into a film to form the concave condensing component 40 with thick edge area and thin middle area, wherein the edge area of the condensing component 40 covers the hydrophilic film layer 50. Wherein, the first ink can be an ordinary printing ink material with a good light transmittance, and the refractive index of the first ink can be adjusted to reach an expected refractive index by adjusting a concentration of the first ink. For example, the first ink is an ink comprising a certain proportion of nanoparticles, and an overall refractive index of the first ink is adjusted by adjusting a concentration of the nanoparticles with different refractive index.

Printing the first ink in the opening 21. Due to the existence of the hydrophilic film layer 50 on the surface of the light shielding layer 20, the first ink will climb towards the surface of the light shielding layer 20 and accumulate in the area close to the light shielding layer 20, so that the amount of ink in the middle area will be less than the amount of ink close to the light shielding layer 20, and the first ink will form the expected concave surface after curing into a film.

The thickness H1 of the edge area of the condensing component 40 with the concave surface formed by the first ink and the thickness H2 of the middle area of the condensing component 40 satisfy the relationship: H1/H2>1.5, and the thickness H1 of the edge area of the condensing component 40 and the length L1 of the bottom surface of the condensing component satisfy the relationship: H1/L1>5%, so as to form the condensing component 40 with the high curvature and improve the light extraction efficiency. Wherein the thickness difference between the thickness H1 of the edge area of the condensing component 40 and the thickness H2 of the middle area of the condensing component 40 can be controlled by controlling the affinity between the light shielding layer 20 and the substrate 10 relative to the first ink forming the condensing component 40. The light shielding layer 20 with the hydrophilic surface will cause the strong climbing phenomenon of the first ink, and then control the strength of the "coffee ring effect" of the first ink to control the thickness difference between the edge area and the middle area of the condensing member 40.

S304: preparing the first color sub-pixel unit 31 and the second color sub-pixel unit 32 of the pixel unit 30 on the condensing component 40.

Specifically, printing a second ink on the condensing component 40 using the ink jet printing process to form the red quantum dot film as the first color sub-pixel unit 31 of the pixel unit 30, and the refractive index of the first color sub-pixel unit 31 is greater than the refractive index of the condensing component 40. Wherein, the first ink is formed by doping the red quantum dots in a polymer solution. Of course, in order to improve the light efficiency of the quantum dots, reduce the amount of the quantum dots, and reduce the cost, inorganic semiconductor materials with high refractive index such as titanium dioxide and zirconia can also be used as the scattering particles and be doped into the polymer solution together with the red quantum dots. Therefore, the light scattered by the scattering particles can excite the quantum dots again, so as to increase optical paths of the excitation light in a quantum dot brightening film, and improve the utilization of blue light. Moreover, selecting the scattering particles with the appropriate particle sizes can also expand the mutual distances between the quantum dots, so as to reduce the self-absorption phenomenon between the quantum dots and improve the light extraction rate. For example, the range of the particle sizes of the scattering particles can be set to 200 nm to 1 micron.

Alternatively, the polymer solution is formed by doping polymers in organic solvents. The polymers comprise one or more of silicone resin, epoxy resin, polyacrylamide, acrylic resin, light curing resin, heat curing resin and other polymer materials.

Further, after the second ink is printed in the opening 21, the printed second ink needs to be cured into a film to form the red quantum dot film as the first color sub-pixel unit 31. The cured film can be cured by a form of UV irradiation, heating, evaporation of solvents or addition of curing agents.

Further, similarly, printing a third ink on the condensing component 40 using the ink jet printing process to form the green quantum dot film as the second color sub-pixel unit 32 of the pixel unit 30, and the refractive index of the second color sub-pixel unit 32 is greater than the refractive index of the condensing component 40. Wherein, the second ink is formed by doping the green quantum dots in a polymer solution. Of course, in order to improve the light efficiency of the quantum dots, reduce the amount of the quantum dots, and reduce the cost, inorganic semiconductor materials with high refractive index such as titanium dioxide and zirconia can also be used as the scattering particles and be doped into the polymer solution together with the green quantum dots. After printing the third ink in the opening 21, the printed third ink needs to be cured into a film to form the green quantum dot film as the second color sub-pixel unit 32, and the openings without providing the red quantum dot film and the green quantum dot film are the third color sub-pixel unit 33 of the pixel unit 30.

In addition, after forming the red quantum dot film and the green quantum dot film, an inorganic film is prepared on the red quantum dot film, the green quantum dot film and the light shielding layer 20 as a protective layer to prevent water vapor and oxygen from invading the red quantum dot film and the green quantum dot film. Wherein, materials of the inorganic film comprise at least one of aluminum nitride, aluminum nitride, titanium nitride, titanium oxide, zirconium nitride, zirconium oxynitride, silicon oxide, silicon nitride, silicon oxynitride, graphene, etc.

In one embodiment, a display panel is also provided. The display panel comprises the color film substrate in the above embodiment and a light-emitting unit. The light-emitting unit is located on one side of the pixel unit away from the substrate, wherein the light-emitting unit is used to provide blue light. The display panel comprises a liquid crystal display (LCD) panel, an organic light emitting display (OLED) panel, etc.

Figure 7:
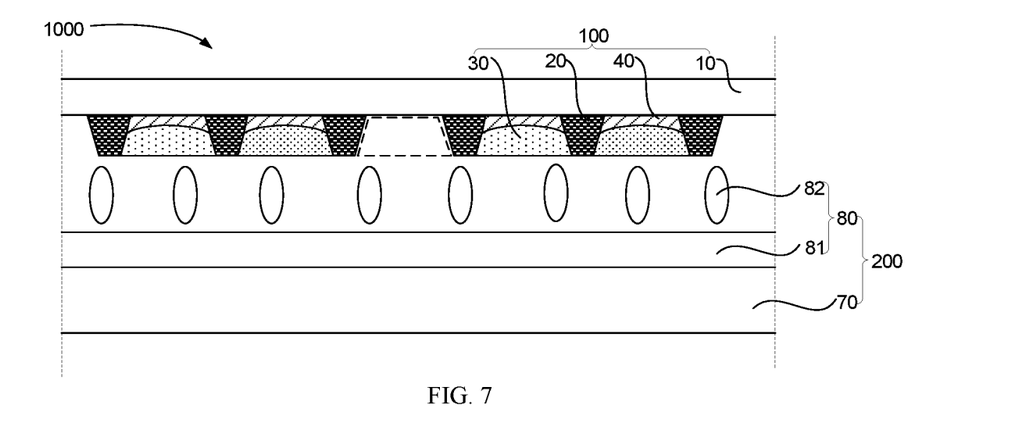
FIG. 7 is one sectional schematic diagram of a display panel provided by the present application.

Specifically, please refer to FIG. 7, which is one sectional schematic diagram of the display panel provided by the present application. The display panel 1000 is the liquid crystal display panel, wherein the liquid crystal display panel comprises the color film substrate 100 and the light-emitting unit 200. The light-emitting unit 200 comprises a backlight module 70 and a liquid crystal box 80 located between the backlight module 70 and the color film substrate 100. The backlight module 70 provides blue backlight to the liquid crystal box 80, and the liquid crystal box 80 controls a transmission of the blue backlight. The blue light passing through the liquid crystal cell 80 is emitted to the color film substrate 100, and the blue light presents different colors through the color film substrate 100 to realize a color display of the liquid crystal display panel. The liquid crystal cell 80 comprises an array substrate 81 and a liquid crystal layer 82, wherein the liquid crystal layer 82 is located between the array substrate 81 and the color film substrate 100.

Figure 8:
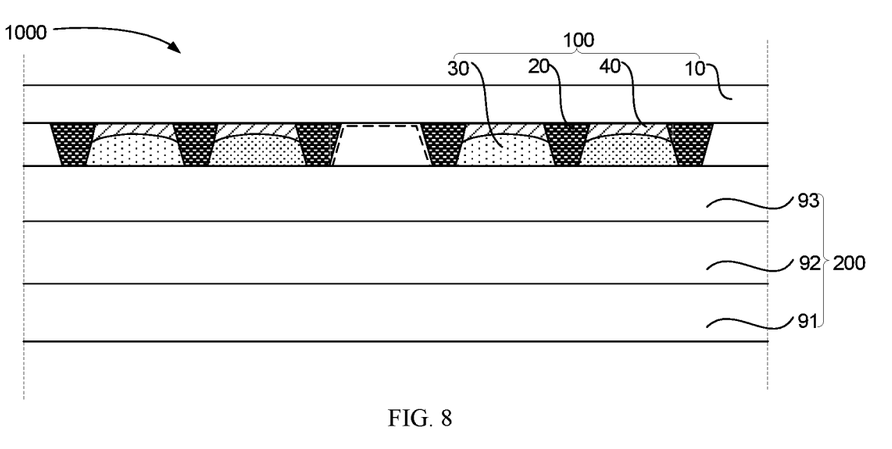
FIG. 8 is another sectional schematic diagram of the display panel provided by the present application.

Please refer to FIG. 8, which is another sectional schematic diagram of the display panel provided by the present application. The display panel 1000 is an OLED panel, the OLED panel comprises the color film substrate 100 and the light-emitting unit 200, the light-emitting unit 200 comprises a driving circuit layer 91 and a light-emitting function layer 92 located between the driving circuit layer 91 and the color film substrate 100. The driving circuit layer 91 drives the light-emitting function layer 92 to emit light, and the light-emitting function layer 92 comprises a plurality of light-emitting devices, each light-emitting device corresponds to a sub-pixel unit on the color film substrate 100. The light-emitting device emits blue light driven by the driving circuit layer 91, and the blue light presents different colors through the color film substrate 100 to realize a color display of the OLED panel. Of course, in order to protect the light-emitting functional layer 92, a packaging layer 93 is also arranged between the light-emitting functional layer 92 and the color film substrate 100. The packaging layer 93 can prevent water and oxygen from invading the light-emitting functional layer 92 and avoid a failure of the light-emitting device of the light-emitting functional layer 92.

According to the Above Embodiments

The present application provides the color film substrate, the method for preparing the color film substrate, and the display panel, wherein the color film substrate comprises the substrate, the light shielding layer and the plurality of pixel units arranged on the substrate. Wherein the plurality of openings are formed on the light shielding layer, and each opening exposes the part of the substrate, each of the pixel unit comprises the first color sub-pixel unit, the second color sub-pixel unit and the third color sub-pixel unit respectively located in different openings, in the corresponding opening, the condensing component is arranged between the first color sub-pixel unit and the second color sub-pixel unit and the substrate, and the condensing component is used for converging emitted light of the first color sub-pixel unit and the second color sub-pixel unit, so as to change the emission angle of the emitted light, reduce the probability of total reflection of the emitted light at the interface of the substrate, and improve the light extraction efficiency of the emitted light. Thus, the brightness under the front viewing angle is increased, and the problem of the poor light extraction efficiency of the existing QDCF structures under the front viewing angle is solved.

In the above embodiments, descriptions of each embodiment have their own emphasis. For parts not detailed in one embodiment, please refer to relevant descriptions of other embodiments.

The embodiments of the present application have been introduced in detail above. In this paper, specific examples have been applied to explain principles and implementation modes of the present application. The description of the above embodiments is only used to help understand a technical scheme and core idea of the present application; those skilled in the art should understand that they can still modify the technical scheme recorded in the above embodiments, or equivalent replace some of technical features; these modifications or substitutions do not separate an essence of the corresponding technical scheme from a scope of the technical scheme of each embodiment of the present application.

What is claimed is:

1. A color film substrate, comprising:
   a substrate;
   a light shielding layer, wherein the light shielding layer is arranged on one side of the substrate, and the light shielding layer is provided with a plurality of openings, and each opening exposes a part of the substrate; and
   a plurality of pixel units disposed in the plurality of openings of the light shielding layer, wherein each of the pixel units comprises a first color sub-pixel unit, a second color sub-pixel unit and a third color sub-pixel unit respectively located in different openings of the plurality of openings;
   wherein one condensing component and the first color sub-pixel unit are arranged in one of the plurality of openings of the light shielding layer, and the one condensing component is disposed between the first color sub-pixel unit and the substrate; another condensing component and the second color sub-pixel unit are arranged in one of the plurality of openings of the light shielding layer, and the another condensing component is disposed between the second color sub-pixel unit and the substrate; and the one condensing component and the another condensing component are used for converging emitted light of the first color sub-pixel unit and the second color sub-pixel unit, respectively.

2. The color film substrate according to claim 1, wherein a cross section of a contact surface between the condensing component and the corresponding pixel unit is an arc, and a center of the arc is located on one side of the corresponding pixel unit.

3. The color film substrate according to claim 2, wherein a refractive index of the condensing component is less than a refractive index of the corresponding pixel unit.

4. The color film substrate according to claim 3, wherein a thickness H1 of an edge area of the condensing component and a thickness H2 of a middle area of the condensing component satisfy a relationship: $H1/H2>1.5$.

5. The color film substrate according to claim 4, wherein the thickness H1 of the edge area of the condensing component and a length L1 of a bottom surface of the condensing component satisfy a relationship: $H1/L1>5\%$.

6. The color film substrate according to claim 2, wherein a hydrophilic film layer is provided on a surface of the light shielding layer corresponding to the condensing component, wherein the hydrophilic film layer is disposed on a part of an inner wall of the opening and between the light shielding layer and the condensing component.

7. The color film substrate according to claim 1, wherein the first color sub-pixel unit comprises a red quantum dot film, the second color sub-pixel unit comprises a green quantum dot film, and the third color sub-pixel unit directly transmits blue light.

8. The color film substrate according to claim 1, wherein a reflection layer is provided on an inner wall of each of the two openings corresponding to the first color sub-pixel unit and the second color sub-pixel unit, wherein the reflection layer is disposed between the condensing component and the light shielding layer.

9. A display panel, which comprises a color film substrate and a light-emitting unit, wherein the color film substrate comprises:
   a substrate;
   a light shielding layer, wherein the light shielding layer is arranged on one side of the substrate, and the light shielding layer is provided with a plurality of openings, and each opening exposes a part of the substrate; and
   a plurality of pixel units disposed in the plurality of openings of the light shielding layer, wherein each of the pixel unit comprises a first color sub-pixel unit, a second color sub-pixel unit and a third color sub-pixel unit respectively located in different openings of the plurality of openings;
   wherein one condensing component and the first color sub-pixel unit are arranged in one of the plurality of openings of the light shielding layer, and the one condensing component is disposed between the first color sub-pixel unit and the substrate; another condensing component and the second color sub-pixel unit are arranged in one of the plurality of openings of the light shielding layer, and the another condensing component is disposed between the second color sub-pixel unit and the substrate; and the one condensing component and the another condensing component are used for converging emitted light of the first color sub-pixel unit and the second color sub-pixel unit, respectively.

10. The display panel according to claim 9, wherein a cross section of a contact surface between the condensing component and the corresponding pixel unit is an arc, and a center of the arc is located on one side of the corresponding pixel unit.

11. The display panel according to claim 10, wherein a refractive index of the condensing component is less than a refractive index of the corresponding pixel unit.

12. The display panel according to claim 11, wherein a thickness H1 of an edge area of the condensing component and a thickness H2 of a middle area of the condensing component satisfy a relationship: $H1/H2>1.5$.

13. The display panel according to claim 12, wherein the thickness H1 of the edge area of the condensing component and a length L1 of a bottom surface of the condensing component satisfy a relationship: $H1/L1>5\%$.

14. The display panel according to claim 10, wherein a hydrophilic film layer is provided on a surface of the light shielding layer corresponding to the condensing component, wherein the hydrophilic film layer is disposed on a part of an inner wall of the opening and between the light shielding layer and the condensing component.

15. The display panel according to claim 9, wherein the first color sub-pixel unit comprises a red quantum dot film, the second color sub-pixel unit comprises a green quantum dot film, and the third color sub-pixel unit directly transmits blue light.

16. A method for preparing a color film substrate, comprising:
providing a substrate;
preparing a light shielding layer on the substrate, and patterning the light shielding layer to form a plurality of openings;
printing a first ink in two of the openings using an ink jet printing process to form two condensing components in the two of the openings respectively; and
preparing a first color sub-pixel unit and a second color sub-pixel unit on the two condensing components, wherein one of the two condensing components and the first color sub-pixel unit are arranged in one of the plurality of openings of the light shielding layer, and the one of the two condensing components is disposed between the first color sub-pixel unit and the substrate; another of the two condensing components and the second color sub-pixel unit are arranged in one of the plurality of openings of the light shielding layer, and the another of the two condensing components is disposed between the second color sub-pixel unit and the substrate; and the one condensing component and the another condensing component are used for converging emitted light of the first color sub-pixel unit and the second color sub-pixel unit, respectively.

17. The method for preparing the color film substrate according to claim 16, wherein the step of printing the first ink in two of the three openings corresponding to the pixel unit using the ink jet printing process to form the condensing component further comprises:
coating a hydrophilic film layer on partial inner walls of the two openings corresponding to the pixel unit; and
printing the first ink in the opening coated with the hydrophilic film layer and drying to form a film to form the concave condensing component with a thick edge area and a thin middle area.

18. The method for preparing the color film substrate according to claim 17, wherein a thickness H1 of the edge area of the condensing component and a thickness H2 of the middle area of the condensing component satisfy a relationship: $H1/H2>1.5$.

19. The method for preparing the color film substrate according to claim 17, wherein the thickness H1 of the edge area of the condensing component and a length L1 of a bottom surface of the condensing component satisfy a relationship: $H1/L1>5\%$.

20. The method for preparing the color film substrate according to claim 16, wherein the step of preparing the first color sub-pixel unit and the second color sub-pixel unit of the pixel unit on the condensing component further comprises:
printing a second ink on the condensing component using the ink jet printing process to form a red quantum dot film as the first color sub-pixel unit of the pixel unit, and a refractive index of the first color sub-pixel unit is greater than that of the condensing component; and
printing a third ink on the condensing component using the ink jet printing process to form a green quantum dot film as the second color sub-pixel unit of the pixel unit, and a refractive index of the second color sub-pixel unit is greater than that of the condensing component.

* * * * *